(12) United States Patent
Ryu et al.

(10) Patent No.: US 8,994,023 B2
(45) Date of Patent: Mar. 31, 2015

(54) THIN FILM TRANSISTOR ARRAY SUBSTRATE AND METHOD OF FABRICATING THE SAME

(75) Inventors: Hye-Young Ryu, Seoul (KR);
 Woo-Geun Lee, Yongin-si (KR);
 Young-Joo Choi, Yongin-si (KR);
 Kyoung-Jae Chung, Seoul (KR);
 Jin-Won Lee, Cheonan-si (KR);
 Seung-Ha Choi, Suwon-si (KR);
 Hee-Jun Byeon, Suwon-si (KR);
 Pil-Sang Yun, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 689 days.

(21) Appl. No.: 13/115,088

(22) Filed: May 24, 2011

(65) Prior Publication Data
US 2012/0037906 A1    Feb. 16, 2012

(30) Foreign Application Priority Data
Aug. 11, 2010 (KR) ........................ 10-2010-0077300

(51) Int. Cl.
| | |
|---|---|
| *H01L 47/00* | (2006.01) |
| *H01L 29/10* | (2006.01) |
| *H01L 29/04* | (2006.01) |
| *H01L 29/15* | (2006.01) |
| *H01L 27/12* | (2006.01) |

(52) U.S. Cl.
CPC ........ *H01L 27/1214* (2013.01); *H01L 27/1225* (2013.01)
USPC ...... 257/57; 257/4; 257/43; 257/76; 257/270; 257/330; 438/381; 438/382; 365/43

(58) Field of Classification Search
USPC ............ 257/4, 76, 330, 43, 270, 57, E29.262, 257/E21.662, E21.667, E21.666; 438/381, 438/382; 365/43
See application file for complete search history.

(56) References Cited

U.S. PATENT DOCUMENTS

| | | | |
|---|---|---|---|
| 2006/0268216 | A1* | 11/2006 | Song .............................. 349/158 |
| 2010/0258805 | A1* | 10/2010 | Ikeda et al. ...................... 257/59 |

FOREIGN PATENT DOCUMENTS

| | | |
|---|---|---|
| CN | 1841781 | 10/2006 |
| CN | 101710592 | 5/2010 |
| JP | 06-314789 | 11/1994 |
| JP | 08-181319 | 7/1996 |
| JP | 09-326493 | 12/1997 |
| JP | 2007-157916 | 6/2007 |
| JP | 2009-099847 | 5/2009 |
| JP | 2009-141341 | 6/2009 |
| KR | 10-2009-0126813 | 12/2009 |

\* cited by examiner

*Primary Examiner* — Chuong A Luu
*Assistant Examiner* — Cory Eskridge
(74) *Attorney, Agent, or Firm* — H.C. Park & Associates, PLC

(57) ABSTRACT

A thin film transistor array substrate capable of reducing degradation of a device due to degradation of an oxide semiconductor pattern and a method of fabricating the same are provided. The thin film transistor array substrate may include an insulating substrate on which a gate electrode is formed, a gate insulating film formed on the insulating substrate, an oxide semiconductor pattern disposed on the gate insulating film, an anti-etching pattern formed on the oxide semiconductor pattern, and a source electrode and a drain electrode formed on the anti-etching pattern. The oxide semiconductor pattern may include an edge portion positioned between the source electrode and the drain electrode, and the edge portion may include at least one conductive region and at least one non-conductive region.

15 Claims, 13 Drawing Sheets

THIN FILM TRANSISTOR ARRAY SUBSTRATE AND METHOD OF FABRICATING THE SAME

This application claims priority from and the benefit of Korean Patent Application No. 10-2010-0077300 filed on Aug. 11, 2010, which is hereby incorporated by reference for all purposes as if fully set forth herein.

BACKGROUND OF THE INVENTION

1. Field of the Invention

Exemplary embodiments of the present invention relate to a thin film transistor array substrate capable of reducing degradation of a device due to degradation of an oxide semiconductor pattern, and a method of fabricating the same.

2. Description of the Background

A liquid crystal display (LCD) is one of the most widely-used flat panel displays (FPDs). A LCD may include two substrates on which electrodes are formed, and a liquid crystal layer interposed between the substrates. Voltages may be applied to the electrodes to change the orientation of liquid crystal molecules of the liquid crystal layer to control the amount of light transmitted by the LCD.

Generally, a LCD may include thin film transistors (TFTs) for controlling pixels. A TFT may include a gate electrode to which a switching signal is applied, a source electrode to which a data voltage is applied, and a drain electrode for outputting the data voltage, thereby forming a switching element having three terminals. The TFT may include an active layer formed between the gate electrode and the source electrode, and the gate electrode and the drain electrode. The active layer included in the TFT may generally be formed of an amorphous silicon layer. Due to an increasing demand for a high performance device with a large display size, the use of oxide semiconductors in TFTs is being researched.

If a TFT is fabricated using an oxide semiconductor, degradation of the TFT may occur due to degradation of an oxide semiconductor layer during etching and deposition processes. Therefore, a structure and method capable of reducing the degradation of a TFT due to degradation of the oxide semiconductor layer is needed.

SUMMARY OF THE INVENTION

Exemplary embodiments of the present invention provide a thin film transistor array substrate capable of reducing degradation of a device resulting from degradation of an oxide semiconductor pattern.

Exemplary embodiments of the present invention also provide a method of fabricating a thin film transistor array substrate capable of reducing degradation of a device resulting from degradation of an oxide semiconductor pattern.

Additional features of the invention will be set forth in the description which follows, and in part will be apparent from the description, or may be learned by practice of the invention.

Exemplary embodiments of the present invention provide a thin film transistor array substrate including a gate electrode, a gate insulating film, an oxide semiconductor pattern, an anti-etching pattern, a source electrode, and a drain electrode. The gate electrode is disposed on a substrate. The gate insulating film is disposed on the substrate. The oxide semiconductor pattern is disposed on the gate insulating film. The anti-etching pattern is disposed on the oxide semiconductor pattern. The source electrode and the drain electrode are disposed on the anti-etching pattern. The oxide semiconductor pattern includes an edge portion, and the edge portion includes a conductive region and a non-conductive region.

Exemplary embodiments of the present invention also provide a thin film transistor array substrate including a gate electrode, a gate insulating film, an oxide semiconductor pattern, an anti-etching pattern, a passivation film, and a column spacer. The gate electrode is disposed on a substrate. The gate insulating film is disposed on the substrate. The oxide semiconductor pattern is disposed on the gate insulating film. The anti-etching pattern is disposed on the oxide semiconductor pattern. The passivation film is disposed on the anti-etching pattern. The column spacer is formed through the passivation film and the gate insulating film. The column spacer includes a first sidewall in contact with the passivation film, the anti-etching pattern, the oxide semiconductor pattern, and the gate insulating film, and a second sidewall in contact with the passivation film and the gate insulating film.

Exemplary embodiments of the present invention provide an method of fabricating a thin film transistor array substrate including sequentially forming a gate insulating film, an oxide semiconductor layer, and an anti-etching film on a substrate including a gate electrode, forming a preliminary anti-etching pattern by patterning the anti-etching film, and forming, on the oxide semiconductor layer and the preliminary anti-etching pattern, a source electrode and a drain electrode spaced apart from the source electrode. The method further includes forming a preliminary oxide semiconductor pattern by patterning the oxide semiconductor layer using the preliminary anti-etching pattern, the source electrode and the drain electrode as a mask, forming a passivation film on the preliminary anti-etching pattern, the source electrode, and the drain electrode, and forming at least one column spacer opening through the passivation film. Forming at least one column spacer opening include forming an anti-etching pattern and an oxide semiconductor pattern by etching a portion of the preliminary anti-etching pattern and a region of the preliminary oxide semiconductor pattern overlapping a portion of the preliminary anti-etching pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1A:
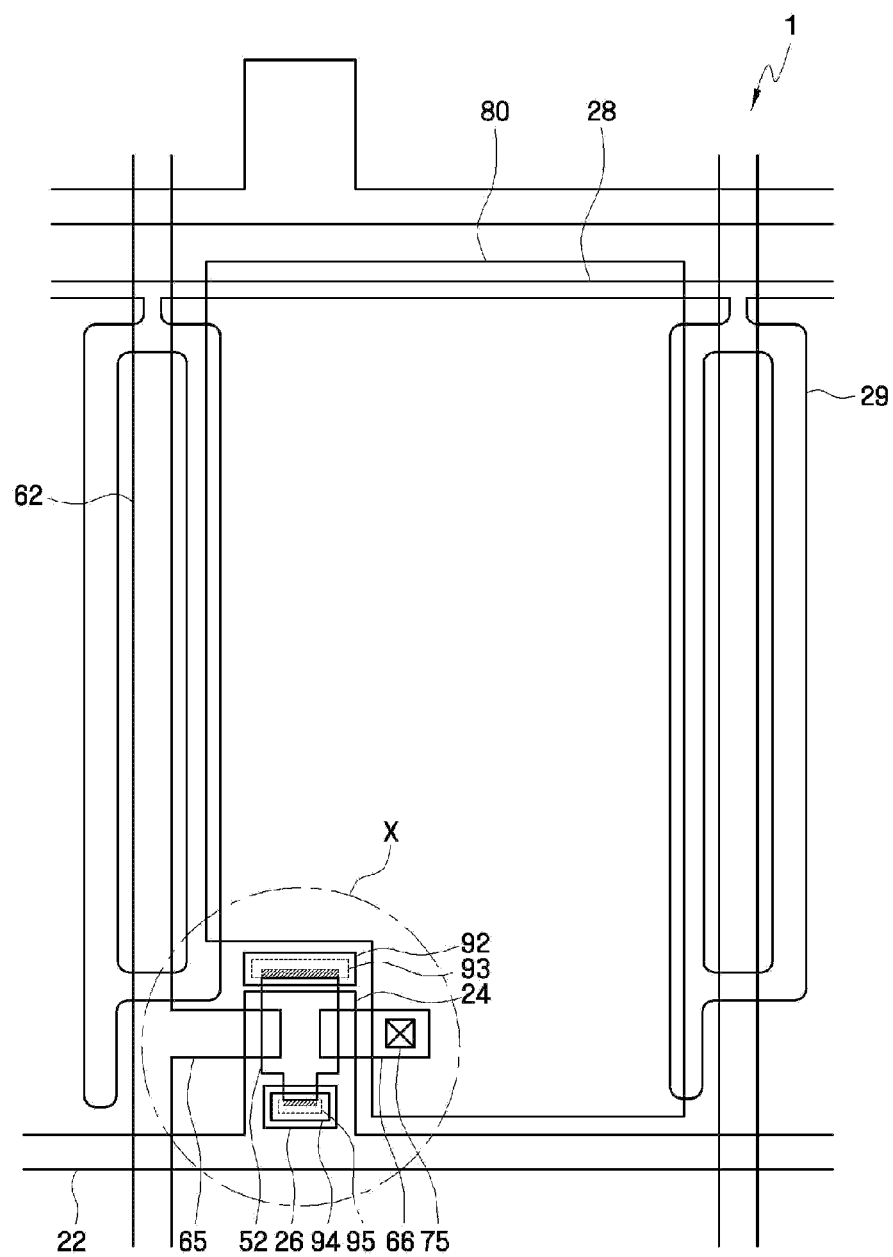
FIG. 1A illustrates a layout of a thin film transistor array substrate according to exemplary embodiments of the present invention.

Advantages and features of exemplary embodiments of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Throughout the specification, like reference numerals in the drawings denote like elements.

Figure 1B:
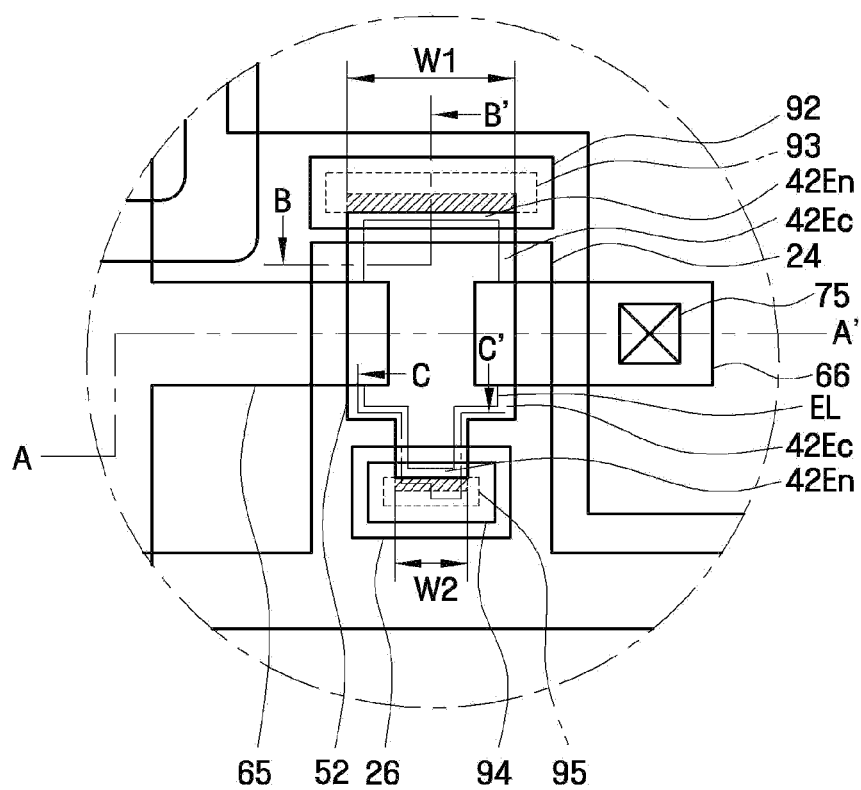
FIG. 1B is an enlarged view of circle X in FIG. 1A according to exemplary embodiments of the present invention.
Figure 2A:
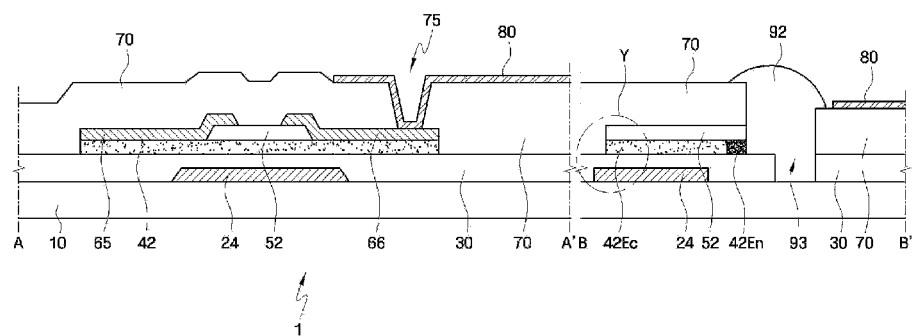
FIG. 2A illustrates cross sectional views taken along lines A-A' and B-B' of FIG. 1B according to exemplary embodiments of the present invention.
Figure 2B:
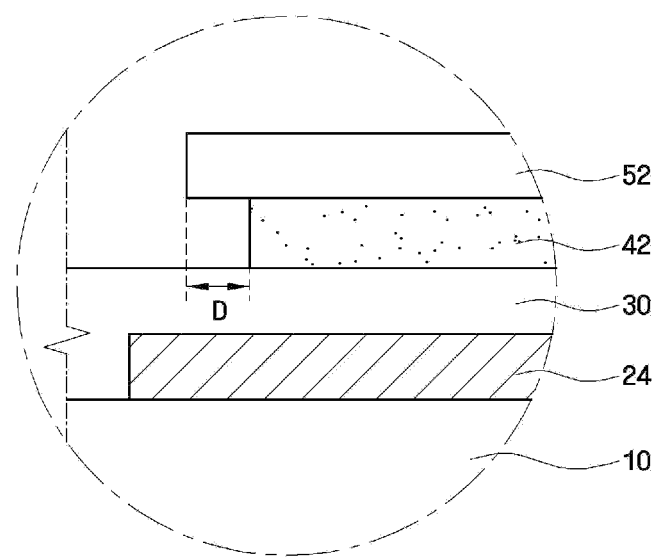
FIG. 2B is an enlarged view of circle Y in FIG. 2A according to exemplary embodiments of the present invention.
Figure 3:
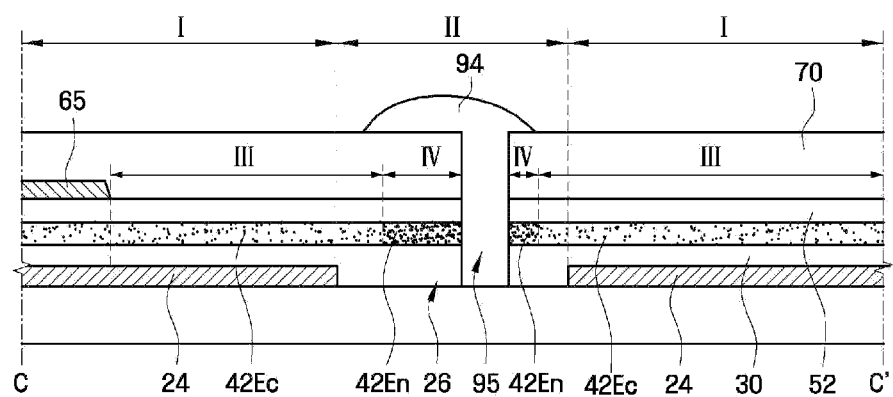
FIG. 3 is a cross sectional view taken along line C-C' of FIG. 1B according to exemplary embodiments of the present invention.

Hereinafter, a thin film transistor array substrate 1 in accordance with exemplary embodiments of the present invention will be described in detail with reference to FIG. 1A, FIG. 1B, FIG. 2A, FIG. 2B, and FIG. 3. FIG. 1A illustrates a layout of the thin film transistor array substrate according to exemplary embodiments of the present invention. FIG. 1B is an enlarged view of circle X in FIG. 1A. FIG. 2A illustrates cross sectional views taken along lines A-A' and B-B' of FIG. 1B. FIG. 2B is an enlarged view of circle Y in FIG. 2A. FIG. 3 is a cross sectional view taken along line C-C' of FIG. 1B.

Referring to FIG. 1A, FIG. 1B, FIG. 2A, FIG. 2B, and FIG. 3, gate wirings 22 and 24 may transmit a gate signal and may be formed on an insulating substrate 10. The insulating substrate 10 may be formed of any suitable material including, for example, glass such as soda lime glass and borosilicate glass or plastic. The gate wirings 22 and 24 may include a gate line 22 extending in a horizontal direction, and a gate electrode 24 of a thin film transistor. The gate electrode 24 may be connected to the gate line 22 and formed in a protruded shape. The gate electrode 24 may include a gate electrode opening 26. A column spacer 94 may be arranged in the gate electrode opening 26 as shall be described in further detail below.

Storage wirings 28 and 29 may supply a storage voltage and may be formed on the insulating substrate 10. Storage wirings 28 and 29 may include a storage line 28 formed across a pixel region, and a storage electrode 29 branched from the storage line 28. The storage line 28 may extend in parallel to the gate line 22 and the storage electrode 29 may extend in parallel to a data line 62.

The storage electrode 29 may be formed in a rectangular ring shape along the data line 62 (see FIG. 1A). For example, an opening region may be formed in a central portion of the storage electrode 29 such that the data line 62 is positioned in the opening region. A ring portion of the storage electrode 29 may at least partially overlap a pixel electrode 80, thereby forming a storage capacitor to improve the charge storage capacity of a pixel. Further, the storage electrode 29 may serve as a blocking electrode capable of preventing coupling between the pixel electrode 80 and the data line 62.

The shape and arrangement of the storage electrode 29 and the storage line 28 are not limited to those illustrated in the drawings and may be modified in various ways. For example, if the storage capacitance generated by overlapping of the pixel electrode 80 and the gate line 22 is sufficient, the storage electrode 29 and the storage line 28 may not be formed.

A gate insulating film 30 may be formed on the insulating substrate 10 and the gate wirings 22 and 24. The gate insulating film 30 may be formed of any suitable material including, for example, silicon oxide (SiOx), silicon nitride (SiNx), silicon oxynitride (SiON) or the like, but it is not limited thereto.

An oxide semiconductor pattern 42 may be formed on the gate insulating film 30. The oxide semiconductor pattern 42 may form a channel region of the thin film transistor. The channel region may be formed as a result of the oxide semiconductor pattern 42 overlapping the gate electrode. The oxide semiconductor pattern 42 may be formed to overlap with the data line 62 and an anti-etching pattern 52, which will be described in further detail below.

As shown in FIG. 2A, a sidewall of the anti-etching pattern 52 may be arranged vertically with a sidewall of a passivation film 70 and a sidewall of the oxide semiconductor pattern 42. For example, the sidewalls of the passivation film 70, the anti-etching pattern 52, and the oxide semiconductor pattern 42 may be arranged vertically along one sidewall of column spacers 92 and 94, which will be described in further detail below.

Further, as shown in FIG. 2B, a portion of the oxide semiconductor pattern 42 may be formed inward from the anti-etching pattern 52. For example, a sidewall of the oxide semiconductor pattern 42 may be formed at a distance D from a sidewall of the anti-etching pattern 52.

Accordingly, a sidewall of the anti-etching pattern 52 may protrude from a sidewall of the oxide semiconductor pattern 42 by the distance D. Although the passivation film 70 may be formed below the protruded portion of the anti-etching pattern 52, in some cases, an empty space may exist below the protruded portion of the anti-etching pattern 52 due to an under-cut. The under-cut may occur below the anti-etching pattern 52 if the oxide semiconductor pattern 42 is formed by wet etching.

The oxide semiconductor pattern 42 may contain any suitable material including, for example, a compound having a chemical formula of AxBxOx or AxBxCxOx, wherein x is greater than zero; A, B, and C are different; and O is oxygen. In some cases, A may be Zinc (Zn) or Cadmium (Cd); B may be Gallium (Ga), Tin (Sn), or Indium (In); and C may be Zn, Cd, Ga, In, Tantalum (Ta) or Hafnium (Hf). The oxide semiconductor pattern 42 may include at least one of InZnO, InGaO, InSnO, ZnSnO, GaSnO, GaZnO, GaZnSnO, GaInZnO, HfInZnO, TaInSnO, ZnO, and any combination thereof. Such oxide semiconductors have excellent semiconductor characteristics including the effective mobility of charges that is about 2 to 100 times as high as that of hydrogenated amorphous silicon. The oxide semiconductor pattern 42 may have an amorphous phase, a crystalline phase, or a mixed phase of the amorphous and crystalline phases.

Referring to FIG. 1B and FIG. 2A, the oxide semiconductor pattern 42 may include edge portions 42Ec and 42En positioned between a source electrode 65 and a drain electrode 66. The edge portions 42Ec and 42En may include at least one conductive region 42Ec and at least one non-conductive region 42En. The edge portions 42Ec and 42En may be regions positioned between the source electrode 65 and the drain electrode 66, and positioned along the sidewall of the oxide semiconductor pattern 42. For example, as shown in FIG. 1B, a region from an edge of the oxide semiconductor pattern 42 to a virtual edge line EL defined along the edge of the oxide semiconductor pattern 42 may be defined as the edge portions 42Ec and 42En of the oxide semiconductor pattern 42.

As described above, the edge portions of the oxide semiconductor pattern 42 may include at least one non-conductive region 42En and at least one conductive region 42Ec. The thin film transistor array substrate 1 may be configured to have a conductive region 42Ec adjacent to the source electrode 65, a conductive region 42Ec adjacent to the drain electrode 66, and a non-conductive region 42En between the two conductive regions 42Ec. This configuration is the same in upper and lower portions of the edge portion with respect to the source electrode 65 and the drain electrode 66.

As shown in FIG. 1B and FIG. 3, the oxide semiconductor pattern 42 may include the edge portion of the conductive region 42Ec (in a third region III) between the source and drain electrodes 65 and 66 and the column spacers 92 and 94. The oxide semiconductor pattern 42 may include the edge portion of the non-conductive region 42En (in a fourth region IV) adjacent to the column spacers 92 and 94.

An edge portion of a preliminary oxide semiconductor pattern 42a (see FIG. 5), which will be described in further detail below, may have conductivity due to damage in a process of forming a passivation film 70.

As shown in FIG. 1A and FIG. 1B, hatched areas in column spacer openings 93 and 95, which are openings for forming the column spacers 92 and 94, may be areas wherein a preliminary anti-etching pattern 52a and the preliminary oxide semiconductor pattern 42a overlap with the column spacer openings 93 and 95. A conductive portion in the edge portion of the preliminary oxide semiconductor pattern 42a may overlap with the hatched areas. The hatched areas may be removed in a process of forming the column spacer openings 93 and 95. Accordingly, the oxide semiconductor pattern 42 of the fourth region IV adjacent to the column spacers 92 and 94 may include the edge portion of the non-conductive region 42En.

As described above, at least a portion of the edge portion of the oxide semiconductor pattern 42, which is not in contact with the column spacers 92 and 94, may be the conductive region 42Ec, and at least a portion of the edge portion of the oxide semiconductor pattern 42, which is in contact with or adjacent to the column spacers 92 and 94, may be the non-conductive region 42En.

Since a portion of the edge portion of the oxide semiconductor pattern 42 may include a non-conductive region 42En, the source electrode 65 may not be electrically connected to the drain electrode 66 along the edge portion of the oxide semiconductor pattern 42, even though a residual region of the edge portion of the oxide semiconductor pattern 42 may be a conductive region 42Ec.

The anti-etching pattern 52 may be formed on the oxide semiconductor pattern 42. As shown in FIG. 3, the thin film transistor array substrate 1 may include a first region I in which the anti-etching pattern 52 overlaps with the gate electrode 24 and a second region II in which the anti-etching pattern 52 does not overlap with the gate electrode 24.

The second region II may be formed of one or more second regions, and at least one of the second regions may be formed in the gate electrode opening 26. As shown in FIG. 1A and FIG. 1B, the second region II may correspond to a portion of the anti-etching pattern 52 protruding from the end of the gate electrode 24 which extends from the gate line 22 and a portion of the anti-etching pattern 52 extending to the inside of the gate electrode opening 26.

The anti-etching pattern 52 may have any suitable dimension and/or shape. In some cases, the anti-etching pattern 52 may have a first width W1 and a second width W2 smaller than the first width W1, and may be formed in a T shape. For example, the anti-etching pattern 52 of the second region II arranged in the gate electrode opening 26 may have the second width W2 and the anti-etching pattern 52 arranged outside the gate electrode opening 26 may have the first width W1.

As shown in FIG. 2A and FIG. 3, at least a portion of the sidewall of the anti-etching pattern 52 of the second region II may be arranged vertically with the sidewall of the oxide semiconductor pattern 42. The hatched areas shown in FIG. 1B may be the partial regions of the preliminary oxide semiconductor pattern 42a and the preliminary anti-etching pattern 52a which are removed in an etching process for forming the column spacer openings 93 and 95. For example, the portions of the preliminary oxide semiconductor pattern 42a and the anti-etching pattern 52a overlapping with regions defined as the column spacer openings 93 and 95 are removed in the etching process, so that the sidewall of the anti-etching pattern 52 and the is sidewall of the oxide semiconductor pattern 42 can be arranged vertically.

In some cases, as shown in FIG. 2B, a portion of the sidewall of the anti-etching pattern 52 of the first region I may protrude from the sidewall of the oxide semiconductor pattern 42. A sidewall of the preliminary anti-etching pattern 52a may protrude from a sidewall of the preliminary oxide semiconductor pattern 42a by a predetermined distance D due to an etching process of an oxide semiconductor layer that will be described in further detail below. However, the anti-etching pattern 52 of the first region I may not include a region overlapping with the column spacer openings 93 and 95 unlike the second region II. Accordingly, even after the etching process of the oxide semiconductor layer, the sidewall of the anti-etching pattern 52 of the first region I may be maintained to protrude from the sidewall of the oxide semiconductor pattern 42.

The anti-etching pattern 52 may include any material selected from the group consisting of SiOx and SiNx, where Si is silicon, N is nitrogen, and x is a number greater than 0.

The oxide semiconductor pattern 42 may be patterned in a shape substantially identical to a data wiring 62, 65, and 66 except in the channel region of the thin film transistor since the oxide semiconductor pattern 42 and the data wiring 62, 65 and 66 may be patterned using a single etching mask.

The data wiring 62, 65, and 66 may be formed on the gate insulating film 30, the oxide semiconductor pattern 42, and the anti-etching pattern 52. The data wiring 62, 65, and 66 may include the data line 62 formed vertically to intersect the gate line 22, thereby defining a pixel. The data wiring 62, 65, and 66 may also include the source electrode 65 branched off from the data line 62 to extend to an upper portion of the oxide semiconductor pattern 42, and a drain electrode 66 separated from the source electrode 65 and formed on the oxide semiconductor pattern 42 and the anti-etching pattern 52 to face the source electrode 65 around the gate electrode 24 or the channel region of the thin film transistor.

At lease a portion of the anti-etching pattern 52 may be exposed between the source electrode 65 and the drain electrode 66. The oxide semiconductor pattern 42 may be arranged below the anti-etching pattern 52, the source electrode 65, and the drain electrode 66.

The data wiring 62, 65, and 66 may be directly in contact with the oxide semiconductor pattern 42 and may be formed of a material forming an Ohmic contact. If the data wiring 62, 65, and 66 is formed of a material having a work function smaller than that of a material of the oxide semiconductor pattern 42, an Ohmic contact may be formed between the data wiring 62, 65, and 66 and the oxide semiconductor pattern 42.

The passivation film 70 may be formed on the data wiring 62, 65, and 66 and the anti-etching pattern 52. The passivation film 70 may be formed of any suitable material including, for example, silicon oxide (SiOx), silicon nitride (SiNx), silicon oxynitride (SiON) or the like, but it is not limited thereto. Further, the contact hole 75 and the column spacers 92 and 94 may be formed in the passivation film 70.

The contact hole 75 may be formed to pass through the passivation film 70, and the drain electrode 66 may be electrically connected to the pixel electrode 80 via the contact hole 75. The pixel electrode 80 may be formed of any suitable material including, for example, a transparent conductor such as indium tin oxide (ITO) or indium zinc oxide (IZO) or a reflective conductor such as aluminum, but the pixel electrode 80 is not limited thereto.

The column spacers 92 and 94 may be formed through the passivation film 70 and the gate insulating film 30. Each of the column spacers 92 and 94 may include first and second sidewalls. The first sidewalls of the column spacers 92 and 94 may be in contact with the anti-etching pattern 52, the oxide semiconductor pattern 42, and the gate insulating film 30, and the second sidewalls may be in contact with the passivation film 70 and the gate insulating film 30. Sidewalls of the passivation film 70, the anti-etching pattern 52, and the gate insulating film 30 may be arranged vertically along sidewalls of the column spacers 92 and 94.

Further, each of the column spacers 92 and 94 may include upper and lower regions. The upper regions of the column spacers 92 and 94 may be formed to have a larger distance between the first and second sidewalls than the distance between the first and second sidewalls in the lower regions of the column spacers 92 and 94. Specifically, the first sidewalls of the upper regions of the column spacers 92 and 94 may be in contact with the passivation film 70, the anti-etching pattern, 52 and the oxide semiconductor pattern 42, and the first sidewalls of the lower regions of the column spacers 92 and 94 may be in contact with the gate insulating film 30. The second sidewalls of the upper regions of the column spacers 92 and 94 may be in contact with the passivation film 70, and the second sidewalls of the lower regions of the column spacers 92 and 94 may be contact with the gate insulating film 30. In addition, in some cases, the upper regions of the column spacers 92 and 94 (and the upper regions of the column spacer openings 93 and 95) may not overlap with the gate electrode 24.

As shown in FIG. 2A and FIG. 3, the column spacers 92 and 94 may overlap with a portion of the passivation film 70. Specifically, the column spacers 92 and 94 may overlap with at least a portion of the passivation film 70 formed in the second region II. Referring to FIG. 1B and FIG. 2A, the column spacers 92 and 94 may overlap the column spacer openings 93 and 95 formed in the passivation film 70 and the gate insulating film 30, and extend to the upper surface of the passivation film 70. As shown in the layout view of FIG. 1B, column spacers 92 and 94 may be formed to include the column spacer openings 93 and 95 (indicated by dotted lines). Accordingly, the column spacers 92 and 94 may overlap with a portion of the passivation film 70 defined as the column spacer openings 93 and 95.

The column spacers 92 and 94 may be formed of one or more column spacers. At least one of the column spacers may be formed in the gate electrode opening 26. As shown in FIG. 1A and FIG. 1B, the column spacers 92 and 94 may include the column spacer 92, which is in contact with a portion of the anti-etching pattern 52 protruding from the end of the gate electrode 24 extending from the gate line 22, and the column spacer 94, which is in contact with a portion of the anti-etching pattern 52 extending to the inside of the gate electrode opening 26.

In general, the column spacers 92 and 94 may be formed of any suitable material including, for example, a transparent organic material or a light blocking material.

When a data voltage is applied to the pixel electrode 80, which is in proximity of a common electrode (not shown) of an upper substrate facing the thin film transistor array substrate, an electric field may be generated and may align liquid crystal molecules of a liquid crystal layer between the pixel electrode 80 and the common electrode.

Hereinafter, a method of fabricating a thin film transistor array substrate 1 in accordance with exemplary embodiments of the present invention will be described in detail with reference to FIG. 1A, FIG. 1B, FIG. 2A, FIG. 2B, FIG. 3, FIG. 4, FIG. 5, FIG. 6, and FIG. 7. FIG. 4, FIG. 5, FIG. 6, and FIG. 7 illustrate cross sectional views showing the sequential steps of a method to fabricate the thin film transistor array substrate 1 in accordance with exemplary embodiments of the present invention.

First, a gate electrode 24 may be formed on the insulating substrate 10. Then, the gate insulating film 30, the oxide semiconductor layer 40, and an anti-etching film may be sequentially deposited on the insulating substrate 10 with the gate electrode 24 formed thereon. The anti-etching film may be patterned to form the preliminary anti-etching pattern 52*a*. Although not shown in the drawings, the gate line 22, the storage line 28, and the storage electrode 29 may be formed at the same time as the gate electrode 24 by using the same mask process.

As noted above, the insulating substrate 10 may be formed of any various suitable materials including, for example, glass such as soda lime glass and borosilicate glass or plastic.

To form the gate wirings 22 and 24, a conductive film for gate lines may be formed on the insulating substrate 10 by using a sputtering method. If the insulating substrate 10 is a soda lime glass having a low heat resistance, a low temperature sputtering method may be used. In general, any suitable technique may be used to form the gate wiring 22 and 24.

Subsequently, the conductive film for gate lines may be patterned by wet etching or dry etching to form the gate wirings 22 and 24. If wet etching is used, an etching solution such as, for example, phosphoric acid, nitric acid, and acetic acid, may be used. If dry etching is used, a chlorine-based etching gas such as, for example, chlorine ($Cl_2$) and Boron Trichloride ($BCl_3$), may be used. Further, the gate line 22 may be formed such that the gate electrode 24 includes the gate electrode opening 26 formed through the gate electrode 24.

Thereafter, the gate insulating film 30 may be formed on the insulating substrate 10 and the gate wirings 22 and 24 using any suitable method including, for example, plasma enhanced chemical vapor deposition (PECVD), reactive sputtering, or the like. The gate insulating film 30 may be formed on at least part of or, in some cases, the entire surface of the insulating substrate 10.

An oxide semiconductor material may be formed on the gate insulating film 30 by using any suitable method including, for example, a sputtering method, thereby resulting in formation of the oxide semiconductor layer 40.

The anti-etching film may be formed on at least part of or, in some cases, the entire surface of the oxide semiconductor layer 40 by using any suitable method including, for example, chemical vapor deposition (CVD). The anti-etching film may be made of any suitable material including, for example, a silicon oxide film or silicon nitride film, but is not limited thereto. Further, the anti-etching film may be patterned using any suitable method including, for example, dry etching, to form the preliminary anti-etching pattern 52a.

Figure 4:
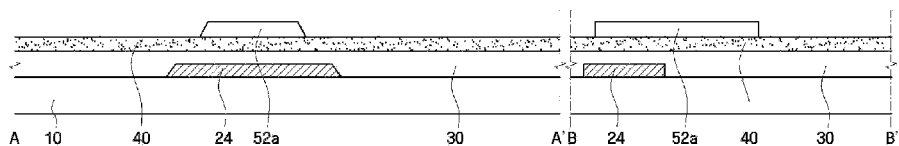
FIG. 4, FIG. 5, FIG. 6, and FIG. 7 illustrate cross sectional views showing the sequential steps of the method of fabricating a thin film transistor array substrate according to exemplary embodiments of the present invention.
Figure 5:
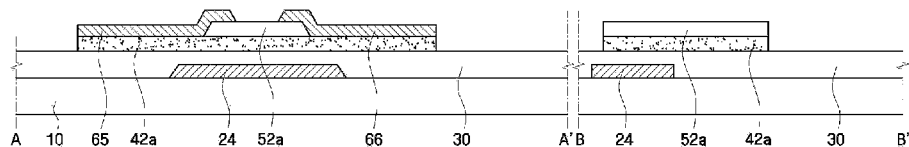

Next, referring to FIG. 4 and FIG. 5, the source electrode 65 and the drain electrode 66 may be formed on the oxide semiconductor layer 40 and the preliminary anti-etching pattern 52a. The oxide semiconductor layer 40 may be patterned by using the preliminary anti-etching pattern 52a, the source electrode 65, and the drain electrode 66 as a mask to form the preliminary oxide semiconductor pattern 42a.

Specifically, a conductive layer for data wiring may be formed on the oxide semiconductor layer 40 and the preliminary anti-etching pattern 52a. The conductive layer for data wiring and the oxide semiconductor layer 40 may be etched simultaneously or sequentially using, for example, wet etching to form the data wiring 62, 65, and 66 and the preliminary oxide semiconductor pattern 42a. The oxide semiconductor layer 40 may be patterned by using the preliminary anti-etching pattern 52a, the source electrode 65, and the drain electrode 66 as a mask.

If the oxide semiconductor layer 40 is etched by wet etching, an under-cut may occur due to the etching solution used. Accordingly, as shown in FIG. 2B, a portion of the oxide semiconductor pattern 42 may be formed inward from the anti-etching pattern 52. In other words, a sidewall of the oxide semiconductor pattern 42 may be formed at a predetermined distance D from a sidewall of the anti-etching pattern 52, and the sidewall of the anti-etching pattern 52 may protrude by the predetermined distance D from a sidewall of the oxide semiconductor pattern 42, as shown in FIG. 2B.

The source electrode 65 and the drain electrode 66 may be formed on both sides of the gate electrode 24 and may be separate from each other. The anti-etching pattern 52 may be exposed in the region where the source electrode 65 is separated from the drain electrode 66.

Figure 6:
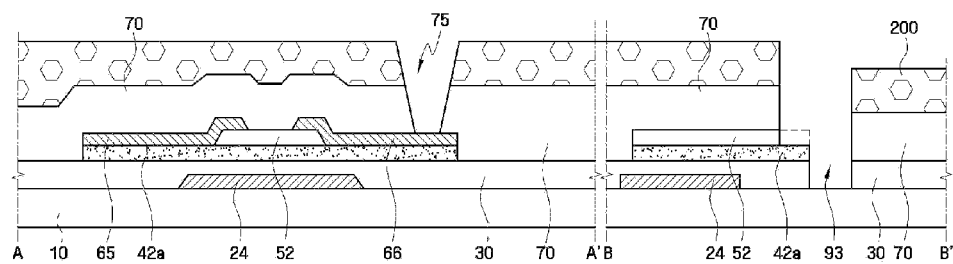

Next, referring to FIG. 6, the passivation film 70 may be formed on the preliminary anti-etching pattern 52a, the source electrode 65, and the drain electrode 66. At least a portion of the preliminary anti-etching pattern 52a of the second region II (see FIG. 3) may be etched to form the anti-etching pattern 52.

The passivation film 70 may be formed by using any suitable method including, for example, PECVD or reactive sputtering. Further, the passivation film 70 may be any suitable material including, for example, a silicon oxide film or silicon nitride film.

The edge portion of the preliminary oxide semiconductor pattern 42a (i.e., the region of the preliminary oxide semiconductor pattern 42a that is in contact with the passivation film 70) may be exposed to a plasma gas or the like during a process of depositing the passivation film 70. The preliminary anti-etching pattern 52a may be disposed on the preliminary oxide semiconductor pattern 42a to protect the upper surface of the preliminary oxide semiconductor pattern 42a from being exposed to the plasma gas or the like. The lower surface of the preliminary oxide semiconductor pattern 42a can be protected by the gate insulating film 30. However, the preliminary oxide semiconductor pattern 42a and a sidewall of the preliminary oxide semiconductor pattern 42a arranged with respect to the data wiring 62, 65, and 66 may be exposed to the plasma gas or the like. Accordingly, the edge portion of the preliminary oxide semiconductor pattern 42a, particularly, the region exposed to the passivation film 70, may be damaged during the deposition process to provide conductivity.

Subsequently, a mask pattern 200 for forming the column spacer openings 93 and 95 may be formed on the passivation film 70, and the passivation film 70 may be patterned by using the mask pattern 200 as a mask. For example, a photolithography process may be used to form the column spacer openings 93 and 95, and a contact hole 75 exposing a portion of the drain electrode 66.

As described above, the first region I may include the preliminary anti-etching pattern 52a overlapping with the gate electrode 24. The preliminary anti-etching pattern 52a does not overlap the gate electrode 24 in the second region II.

As shown in FIG. 6, a region of the passivation film 70 overlapping with at least a portion (portion indicated by a dotted line) of the preliminary anti-etching pattern 52a of the second region II and at least a portion (portion indicated by a dotted line) of the preliminary anti-etching pattern 52a may be etched simultaneously or sequentially to form the anti-etching pattern 52.

The at least a portion (portion indicated by a dotted line) of the preliminary anti-etching pattern 52a of the second region II may be etched earlier than the preliminary oxide semiconductor pattern 42a. For example, when the passivation film 70 is patterned, a portion of the preliminary anti-etching pattern 52a having an etching selectivity similar to that of the passivation film 70 may be removed at the same time. For example, if both the preliminary anti-etching pattern 52a and the passivation film 70 are formed of silicon oxide, the passivation film 70 and the preliminary anti-etching pattern 52a may be removed at the same time. If the preliminary anti-etching pattern 52a and the passivation film 70 are formed of different materials, the passivation film 70 and the preliminary anti-etching pattern 52a may be removed sequentially by using the mask pattern 200.

The mask pattern 200 formed on the passivation film 70 may be defined such that the column spacer opening 93 overlaps with portions of the preliminary anti-etching pattern 52*a* and the preliminary oxide semiconductor pattern 42*a*. Specifically, the mask pattern 200 may expose an overlapping region of the column spacer opening 93 and at least a portion of the edge portion of the preliminary oxide semiconductor pattern 42*a* having conductivity, which belongs to the second region II. As the region exposed by the mask pattern 200 is removed to form the column spacer opening 93, a portion of the edge portion of the oxide semiconductor pattern 42 may be nonconductive. Accordingly, it may be possible to prevent the source electrode 65 from being electrically connected to the drain electrode 66 along the edge portion of the oxide semiconductor pattern 42.

Further, when the passivation film 70 is patterned, the passivation film 70 and the gate insulating film 30 may be removed simultaneously or sequentially. For example, the preliminary oxide semiconductor pattern 42*a* protruding from the anti-etching pattern 52 may serve as an etching mask. Accordingly, a sidewall of the lower region of each of the column spacer openings 93 and 95 that is in contact with the gate insulating film 30 may be defined, at least in part, by a sidewall of the preliminary oxide semiconductor pattern 42*a*. Accordingly, at least one of the column spacer openings 93 and 95 may include an upper region having a first width and a lower region having a second width smaller than the first width. The gate insulating film 30 may be etched such that a sidewall of the lower region of each of the column spacer openings 93 and 95 is arranged vertically with the preliminary oxide semiconductor pattern 42*a*.

In some cases, the preliminary oxide semiconductor pattern 42*a* may have an etching selectivity different from that of the passivation film 70, the preliminary anti-etching pattern 52*a*, and the gate insulating film 30. Accordingly, the preliminary oxide semiconductor pattern 42*a* may be maintained to protrude from the anti-etching pattern 52.

Figure 7:
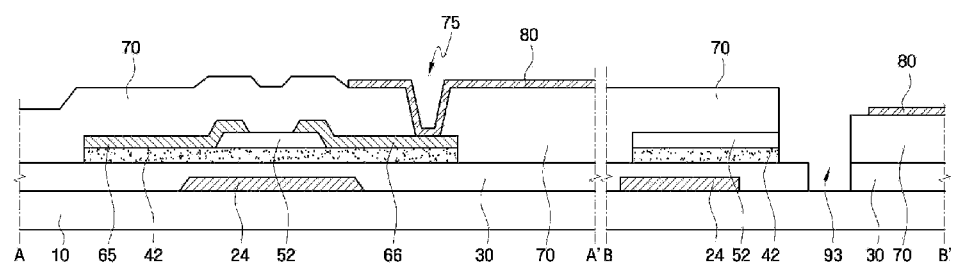

Next, referring to FIG. 7, the oxide semiconductor pattern 42 may be formed by etching a region of the preliminary oxide semiconductor pattern 42*a* overlapping with at least a portion (portion indicated by a dotted line in FIG. 6) of the preliminary anti-etching pattern 52*a* of the second region II.

Specifically, after the anti-etching pattern 52 is formed, a conductive film for a pixel electrode that is partially connected to the data wiring 62, 65, and 66 may be formed on the passivation film 70. The conductive film for a pixel electrode may be any suitable material including, for example, a transparent conductor such as indium tin oxide (ITO) or indium zinc oxide (IZO) or a reflective conductor such as aluminum. The conductive film for a pixel electrode may be connected to the drain electrode 66 via the contact hole 75.

The pixel electrode 80 may be formed by etching the conductive film for a pixel electrode. The oxide semiconductor pattern 42 may be formed by etching a portion of the preliminary oxide semiconductor pattern 42*a* protruding from the anti-etching pattern 52 by using the mask pattern used for forming the pixel electrode 80. In some cases, if the pixel electrode 80 and the preliminary oxide semiconductor pattern 42*a* have a similar etching selectivity, the conductive film for a pixel electrode 80 and the preliminary oxide semiconductor pattern 42*a* may be removed at the same time. In some cases, if the pixel electrode 80 and the preliminary oxide semiconductor pattern 42*a* have different etching selectivities, the conductive film for a pixel electrode 80 and the preliminary oxide semiconductor pattern 42*a* may be etched sequentially.

Accordingly, the column spacer openings 93 and 95 including upper and lower regions having different widths may be formed.

As described above, forming at least one of the column spacer openings 93 and 95 may include forming the anti-etching pattern 52 and the oxide semiconductor pattern 42 by etching a portion of the preliminary anti-etching pattern 52*a* and a region of the preliminary oxide semiconductor pattern 42*a* overlapping a portion of the preliminary anti-etching pattern 52*a*.

Referring again to FIG. 2A, at least one of the column spacers 92 and 94 may be formed by burying a material in at least one of the column spacer openings 93 and 95. The material of the column spacers 92 and 94 may be any suitable material including, for example, a transparent organic material or a light blocking material.

Although a bottom gate structure in which a gate electrode 24 is disposed below an oxide semiconductor layer 42 has been described, exemplary embodiments of the present invention are not limited thereto, and a top gate structure in which a gate electrode is disposed on an oxide semiconductor layer may similarly be implemented to reduce the degradation of a TFT due to the degradation of the oxide semiconductor layer.

Figure 8:
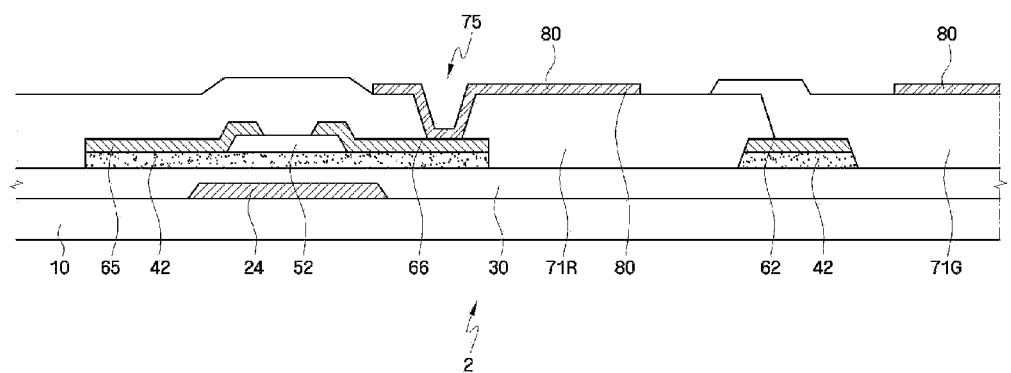
FIG. 8 illustrates a cross sectional view of a thin film transistor array substrate according to exemplary embodiments of the present invention.

Hereinafter, a thin film transistor array substrate 2 in accordance with exemplary embodiments of the present invention will be described in detail with reference to FIG. 8. FIG. 8 illustrates a cross sectional view of a thin film transistor array substrate 2. The thin film transistor array substrate 2 is different from the thin film transistor array substrate 1 described hereinabove in that the thin film transistor array substrate 2 has a color filter on array (COA) structure in which color filters 71R and 71G are formed in place of the passivation film 70 (see FIG. 2A). The same or substantially the same components as those of the thin film transistor array substrate 1 described hereinabove are designated by the same reference numerals, and a detailed description thereof will be omitted.

As shown in FIG. 8, the color filters 71R and 71G or an organic film may be formed in place of a passivation film. Although the color filters 71R and 71G or organic film may be formed on the gate insulating film 30, the anti-etching pattern 52, the source electrode 65, and the drain electrode 66, the source electrode 65 may still be prevented from being electrically connected to the drain electrode 66 along the edge portion of the oxide semiconductor pattern 42.

Figure 9A:
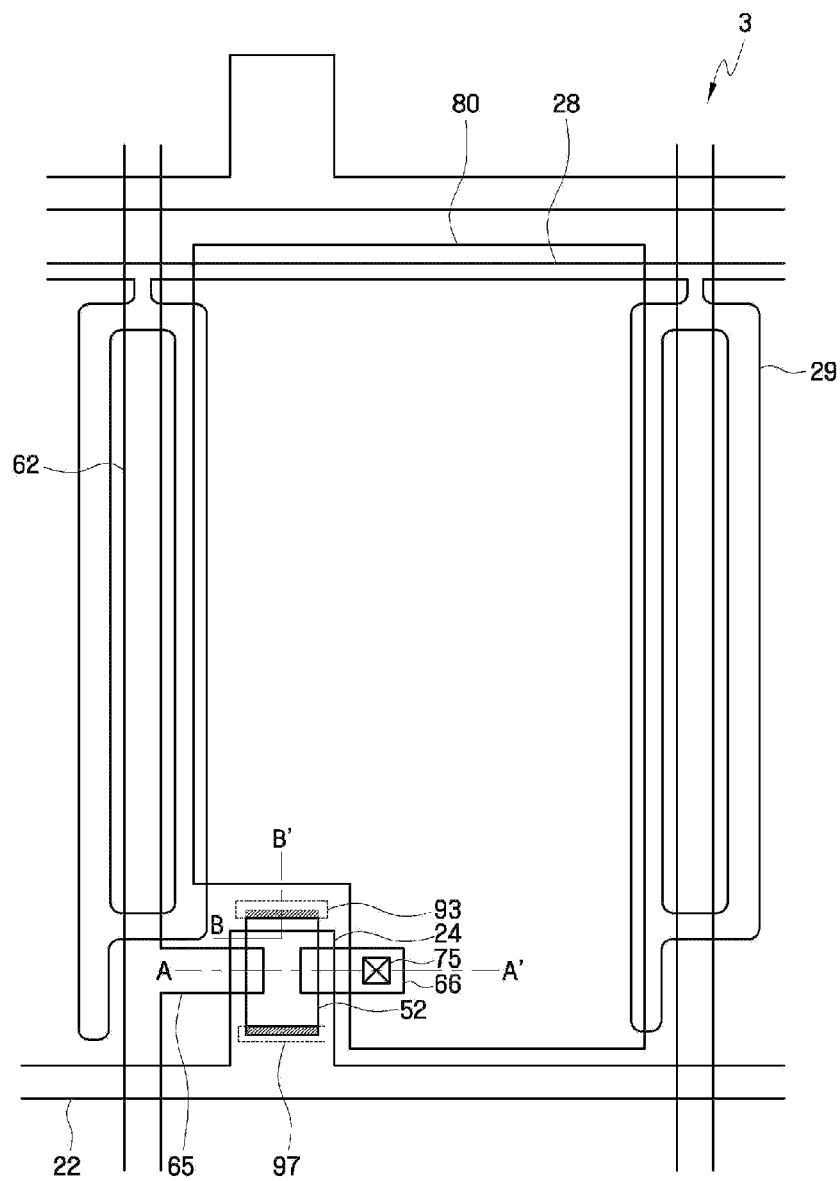
FIG. 9A illustrates a layout of a thin film transistor array substrate according to exemplary embodiments of the present invention.

Hereinafter, a thin film transistor array substrate 3 in accordance with exemplary embodiments of the present invention will be described in detail with reference to FIG. 9A and FIG. 9B. FIG. 9A illustrates a layout of the thin film transistor array substrate 3, and FIG. 9B is a cross sectional view taken along lines A-A' and B-B' of FIG. 9A.

The thin film transistor array substrate 3 is different from the thin film transistor array substrate 1 described hereinabove in that an insulating film 72 may be used in place of the column spacer and may be buried in column spacer openings 93 and 97. The same or substantially the same components as those of the thin film transistor array substrate 1 described hereinabove are designated by the same reference numerals, and a detailed description thereof will be omitted. Reference numerals 93 and 97 denote column spacer "openings" because column spacers are not buried therein.

Figure 9B:
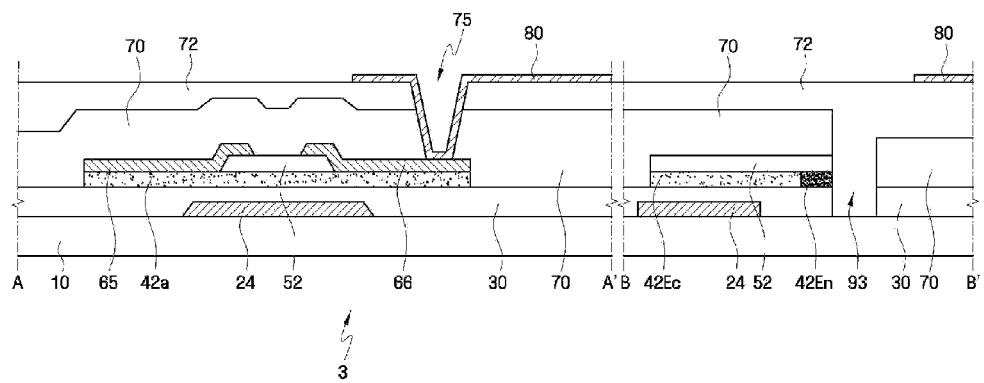
FIG. 9B illustrates cross sectional views taken along lines A-A' and B-B' of FIG. 9A according to exemplary embodiments of the present invention.

As shown in FIG. 9A and FIG. 9B, sides of the oxide semiconductor pattern 42 and the anti etching pattern 52 may be formed in contact with the openings 93 and 97. Regions defined by the openings 93 and 97 may overlap with regions of the preliminary oxide semiconductor pattern 42*a* and the preliminary anti-etching pattern 52*a* and patterns in the overlapping regions may be removed from the openings 93 and 97. Accordingly, an edge portion of the oxide semiconductor pattern 42 may include the conductive region 42Ec and the non-conductive region 42En. Since the edge portion including the conductive region 42Ec and the non-conductive region 42En have been described previously, a repeated description thereof will be omitted.

The openings 93 and 97 may be filled with an insulating film 72. Although the passivation film 70 and the insulating film 72 are illustrated as different layers in the FIG. 9B, exemplary embodiments of the invention are not limited thereto. For example, the passivation film 70 and the insulating film 72 may be combined into a single layer. For example, the passivation film 70 and the insulating film 72 may be formed of the same material thereby providing a single layer of film. In general, various modifications and combinations of the passivation film 70 and insulating film 72 may be used.

Figure 10A:
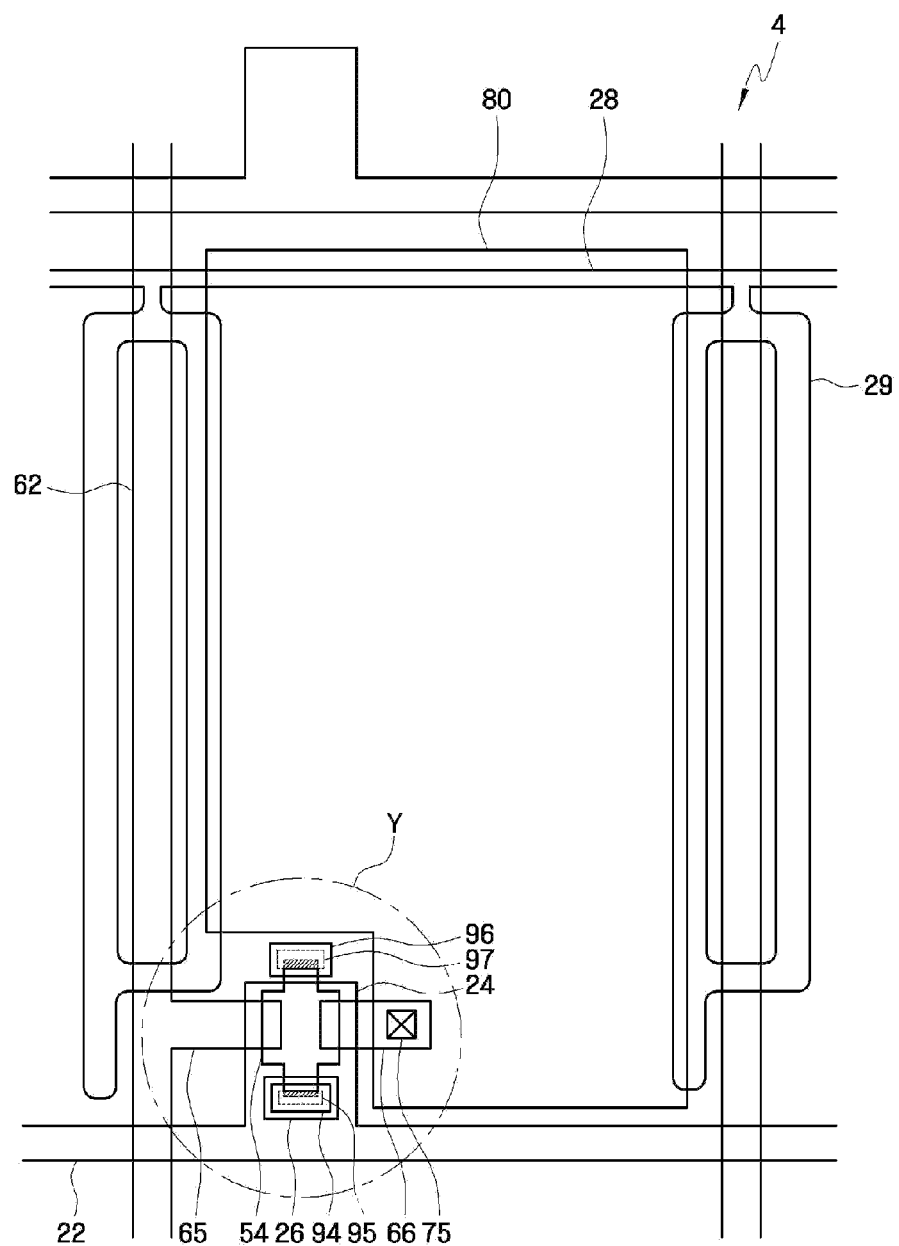
FIG. 10A illustrates a layout of a thin film transistor array substrate according to exemplary embodiments of the present invention

Hereinafter, a thin film transistor array substrate 4 in accordance with exemplary embodiments of the present invention will be described in detail. FIG. 10A illustrates a layout of the thin film transistor array substrate 4 and FIG. 10B is an enlarged view of circle Y in FIG. 10A.

The thin film transistor array substrate 4 is different from the thin film transistor array substrate 1 described hereinabove in that an anti etching pattern 54 may have a crisscross (+) pattern. The same or substantially the same components as those of the thin film transistor array substrate 1 described hereinabove are designated by the same reference numerals, and a detailed description thereof will be omitted.

Figure 10B:
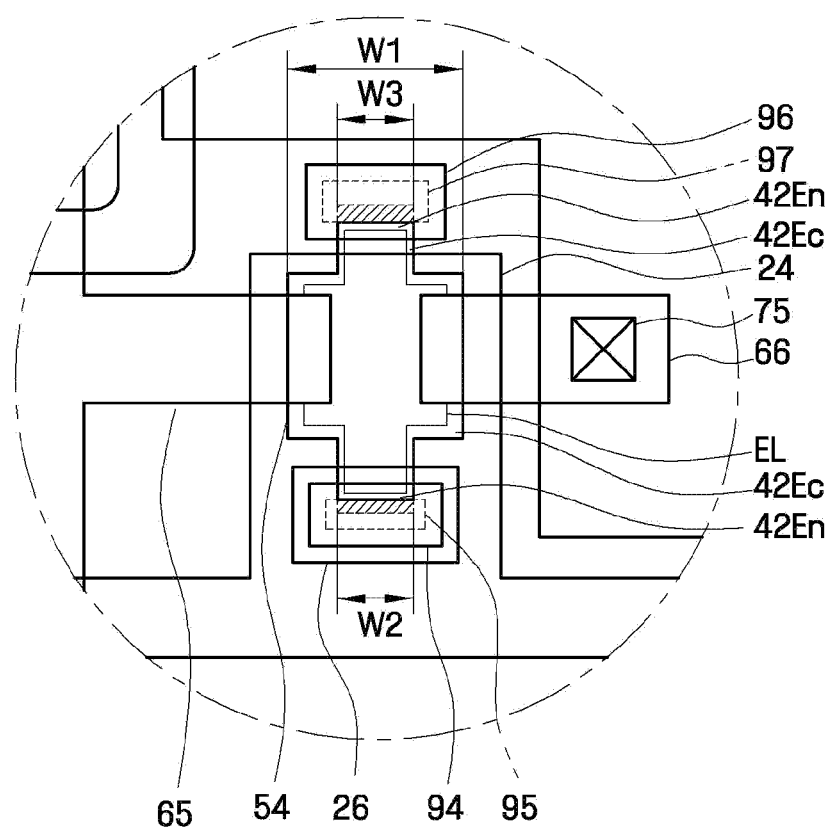
FIG. 10B is an enlarged view of circle Y in FIG. 10A according to exemplary embodiments of the present invention.

Referring to FIG. 10A and FIG. 10B, an anti etching pattern 54 of a first region I may have a first width W1 and the anti etching pattern 54 of a second region II may have a second width W2 and a third width W3. The first width W1 may be larger than the second width W2 and the third width W3.

The third width W3 of the anti etching pattern 54 in the second region II, which protrudes from an end of the gate electrode 24 extending from a gate line 22, may be smaller than the first width W1 of the anti etching pattern 54 in the first region I. Accordingly, the area occupied by column spacers 94 and 96 may be reduced. Thus, if the column spacers 94 and 96 are formed of a light blocking material, an opening ratio can be improved, which is advantageous.

A method of fabricating the thin film transistor array substrate 4 may be substantially the same as the method of fabricating the thin film transistor array substrate 1 described hereinabove except that the preliminary anti-etching pattern 52a is formed by patterning the anti-etching film 54. For example, regions defined by the column spacer openings 97 and 95 may overlap with regions of a preliminary oxide semiconductor pattern and a preliminary anti-etching pattern, and patterns in the overlapping regions may be removed by forming the column spacer openings 97 and 95. Accordingly, an edge portion of an oxide semiconductor pattern 44 may include a conductive region 44Ec and a non-conductive region 44En. Further, patterning of the anti-etching film of the thin film transistor array substrate 4 may be different from the patterning of the anti-etching film of the thin film transistor array substrate 1 in that a shape of the mask pattern may be a crisscross pattern.

Figure 11:
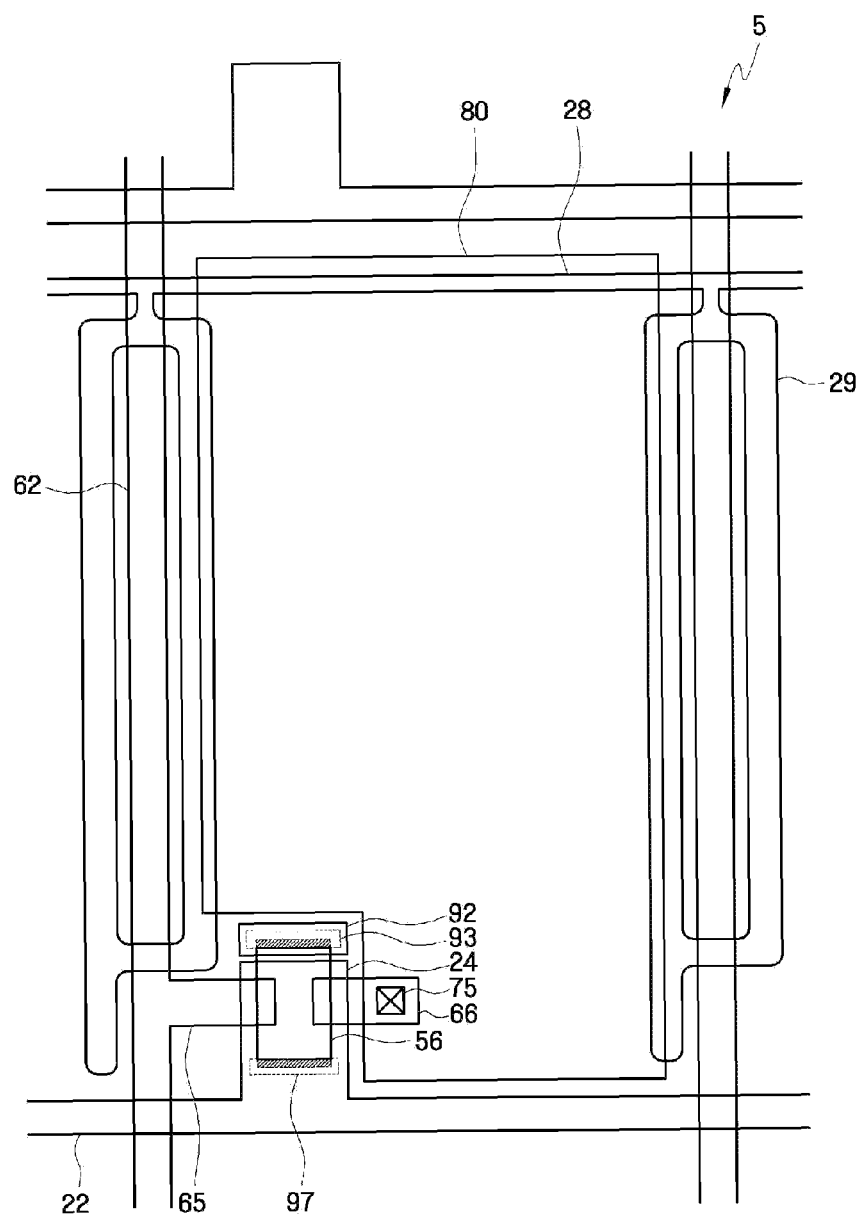
FIG. 11 illustrates a layout of a thin film transistor array substrate according to exemplary embodiments of the present invention.

Hereinafter, a thin film transistor array substrate 5 in accordance with exemplary embodiments of the present invention will be described in detail with reference to FIG. 11. FIG. 11 illustrates a layout of the thin film transistor array substrate 5.

The thin film transistor array substrate 5 is different from the thin film transistor array substrate 1 described hereinabove in that the column spacer 92 is buried in at least one of the column spacer openings 93 and 97. In other words, an insulating material, instead of the column spacer 92, may be buried in at least one or more column spacer openings 93 and 97. For example, any one of the column spacer openings 93 and 97 may be filled with the column spacer 92, and the other one of the column spacer openings 93 and 97 may be filled with an insulating material, instead of the column spacer 92.

The thin film transistor array substrate 5 may include two column spacer openings 93 and 97. One column spacer opening 93 may be filled with the column spacer 92. Although two column spacer openings 93 and 97 are illustrated in FIG. 11, two or more column spacer openings may be formed and the column spacer 92 may be partially buried in the two or more column spacer openings 93 and 97. Here, being "partially buried" may refer to the column spacer 92 being buried in some openings of the column spacer openings 93 and 97. The other openings may be filled with an insulating material as noted above.

Further, as shown in FIG. 11, the anti-etching pattern 56 may be formed to have a single width without variation in width. For example, the anti-etching pattern 56 may be formed in a rectangular shape.

Figure 12A:
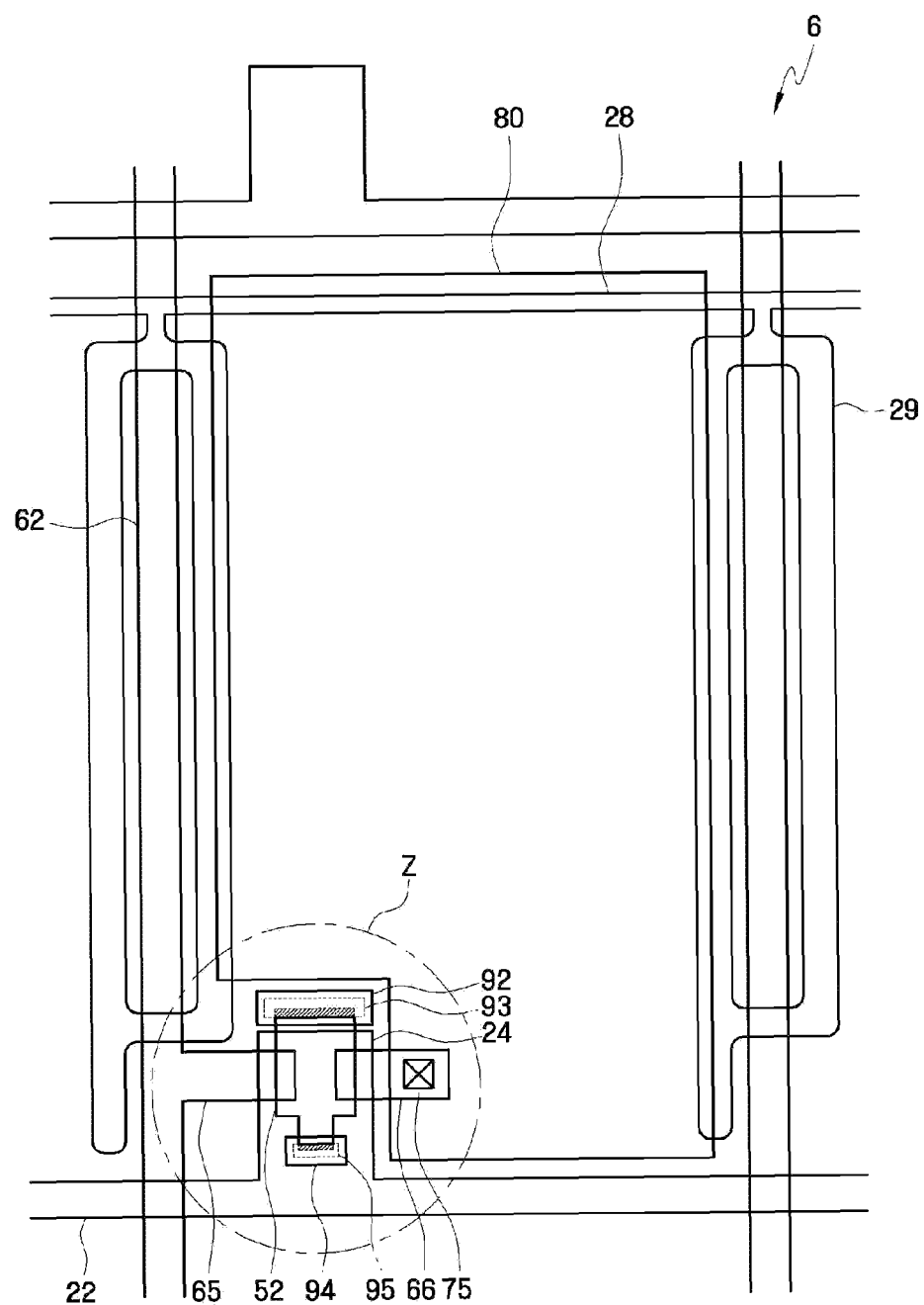
FIG. 12A illustrates a layout of a thin film transistor array substrate according to exemplary embodiments of the present invention.
Figure 12B:
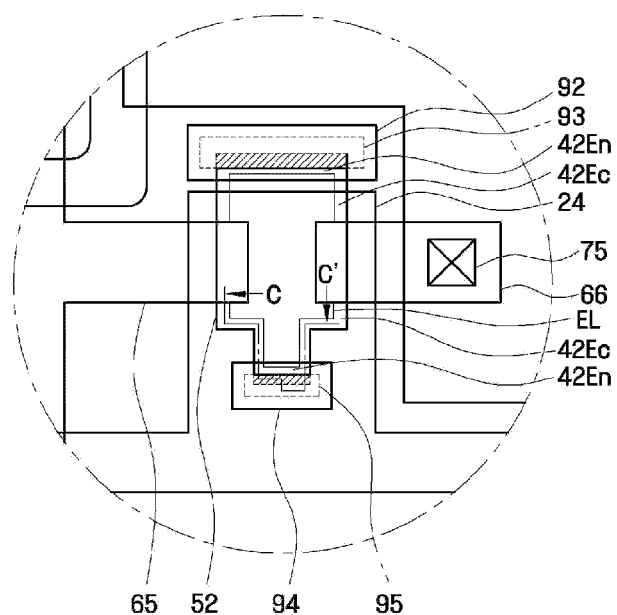
FIG. 12B is an enlarged view of circle Z in FIG. 12A according to exemplary embodiments of the present invention.
Figure 12C:
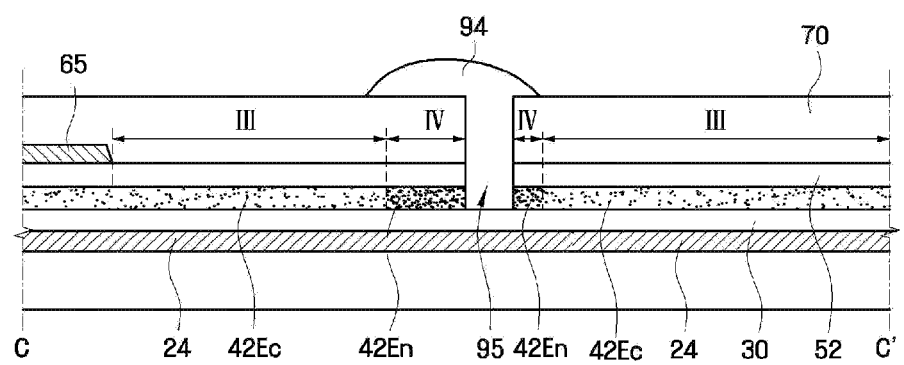
FIG. 12C is a cross sectional view taken along line C-C' of FIG. 12B according to exemplary embodiments of the present invention.

Hereinafter, a thin film transistor array substrate 6 in accordance with exemplary embodiments of the present invention will be described in detail with reference to FIG. 12A, FIG. 12B, and FIG. 12C. FIG. 12A illustrates a layout of the thin film transistor array substrate 6. FIG. 12B is an enlarged view of circle Z in FIG. 12A. FIG. 12C is a cross sectional view taken along line C-C' of FIG. 12B.

The thin film transistor array substrate 6 is different from the thin film transistor array substrates 1 described hereinabove in that no opening is formed in the gate electrode 24.

The thin film transistor array substrate 6 may include a gate electrode 24, and the column spacer openings 93 and 95 may not be formed in the gate electrode 24. The column spacer openings 93 and 95 may be formed in contact with the sidewalls of the anti-etching pattern 52 and the oxide semiconductor pattern 42.

Further, as shown in FIG. 12C, the column spacer opening 95 may be formed to pass through the anti-etching pattern 52 and the oxide semiconductor pattern 42, without passing through the gate electrode 24. In some cases, however, the column spacer opening 95 may pass through the gate insulating film 30.

When the column spacer opening 95 is formed, at least a portion of the gate insulating film 30 corresponding to the column spacer opening 95 may remain by using, for example, a slit mask or the like. Accordingly, the gate electrode 24 may be disposed below the gate insulating film 30, thereby preventing the gate electrode 24 from being exposed directly.

At least one of the column spacer openings 93 and 95 of the thin film transistor array substrate 6 may be filled with an insulating material instead of the column spacer 94, as noted above. In general, the column spacer openings 93 and 95 may be filled with the column spacer 92 or an insulating material.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A thin film transistor array substrate, comprising:
a gate electrode disposed on a substrate;
a gate insulating film disposed on the substrate;
an oxide semiconductor pattern disposed on the gate insulating film;

an anti-etching pattern disposed on the oxide semiconductor pattern;
a source electrode and a drain electrode disposed on the anti-etching pattern;
a passivation film disposed on the anti-etching pattern, the source electrode, and the drain electrode; and
a column spacer formed through the gate insulating film,
wherein the oxide semiconductor pattern comprises an edge portion,
wherein the edge portion comprises a conductive region and a non-conductive region, and
wherein the column spacer overlaps at least a portion of the non-conductive region.

2. The thin film transistor array substrate of claim 1, wherein the column spacer comprises:
a first sidewall in contact with the passivation film, the anti-etching pattern, the oxide semiconductor pattern, and the gate insulating film; and
a second sidewall in contact with the passivation film and the gate insulating film.

3. The thin film transistor array substrate of claim 1, wherein a portion of a sidewall of the anti-etching pattern of the conductive region is formed to protrude from a sidewall of the oxide semiconductor pattern, and at least a portion of a sidewall of the anti-etching pattern of the non-conductive region is arranged vertically with a sidewall of the oxide semiconductor pattern.

4. The thin film transistor array substrate of claim 1, wherein
the non-conductive region comprises a first non-conductive region and a second non-conductive region;
the column spacer comprises a first column spacer and a second column spacer;
the gate electrode comprises a gate electrode opening; and
at least one of the non-conductive regions and at least one of the column spacer are formed in the gate electrode opening.

5. The thin film transistor array substrate of claim 4, wherein the anti-etching pattern disposed on the first non-conductive region not arranged within the gate electrode opening has a first width and the anti-etching pattern disposed on the second non-conductive region arranged within the gate electrode opening has a second width smaller than the first width.

6. The thin film transistor array substrate of claim 1, wherein the anti-etching pattern comprises:
a first region in which the anti-etching pattern overlaps the gate electrode; and
a second region in which the anti-etching pattern does not overlap the gate electrode, and
wherein the first region of the anti-etching pattern has a first width and the second region of the anti-etching pattern has a second width smaller than the first width.

7. A thin film transistor array substrate, comprising:
a gate electrode disposed on a substrate;
a gate insulating film disposed on the substrate;
an oxide semiconductor pattern disposed on the gate insulating film;
an anti-etching pattern disposed on the oxide semiconductor pattern;
a passivation film disposed on the anti-etching pattern, a source electrode, and a drain electrode; and
a column spacer formed through the passivation film and the gate insulating film,
wherein the column spacer overlaps at least a portion of a non-conductive region of the oxide semiconductor pattern,
wherein the column spacer comprises a first sidewall in contact with the passivation film,
the anti-etching pattern, the oxide semiconductor pattern, and the gate insulating film, and a second sidewall in contact with the passivation film and the gate insulating film.

8. The thin film transistor array substrate of claim 7, wherein the oxide semiconductor pattern comprises an edge portion along an edge of the oxide semiconductor pattern, and the edge portion comprises a conductive region and a non-conductive region.

9. The thin film transistor array substrate of claim 8, wherein the conductive region comprises a region in contact with the column spacer.

10. The thin film transistor array substrate of claim 7, wherein the passivation film, the anti-etching pattern, and the oxide semiconductor pattern are arranged vertically along the first sidewall of the column spacer.

11. The thin film transistor array substrate of claim 7, wherein the column spacer comprises an upper region and a lower region, and
wherein a distance between the first sidewall and the second sidewall in the upper region is larger than a distance between the first sidewall and the second sidewall in the lower region.

12. The thin film transistor array substrate of claim 11, wherein the upper region of the column spacer does not overlap with the gate electrode.

13. The thin film transistor array substrate of claim 7, wherein the column spacer overlaps at least a portion of the passivation film.

14. The thin film transistor array substrate of claim 7, wherein the column spacer comprises a transparent organic material or a light blocking material.

15. The thin film transistor array substrate of claim 7, wherein the anti-etching pattern comprises a first region in which the anti-etching pattern overlaps the gate electrode and a second region in which the anti-etching pattern does not overlap with the gate electrode.

* * * * *